United States Patent
Kim

(10) Patent No.: US 7,359,242 B2
(45) Date of Patent: Apr. 15, 2008

(54) SEMICONDUCTOR MEMORY DEVICE WITH SMALL NUMBER OF REPAIR SIGNAL TRANSMISSION LINES

(75) Inventor: Du-Yeul Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 220 days.

(21) Appl. No.: 11/180,505

(22) Filed: Jul. 12, 2005

(65) Prior Publication Data

US 2006/0013049 A1   Jan. 19, 2006

(30) Foreign Application Priority Data

Jul. 13, 2004   (KR) ................. 10-2004-0054491

(51) Int. Cl.
  *G11C 11/34*   (2006.01)
(52) U.S. Cl. .................. 365/185.09; 365/225.7; 365/200; 365/230.03; 365/189.05; 365/230.06
(58) Field of Classification Search ........... 365/185.09, 365/225.7, 200, 230.03, 189.05, 230.06
See application file for complete search history.

(56) References Cited

U.S. PATENT DOCUMENTS 6,084,807 A * 7/2000 Choi ..................... 365/200
6,353,570 B2 * 3/2002 Hwang et al. ........... 365/225.7

FOREIGN PATENT DOCUMENTS

JP   2002-208294   7/2002
KR   0173933   11/1998
KR   2002-0093254   12/2002

OTHER PUBLICATIONS

English language abstract of the Japanese Publication No. 0173933.
English language abstract of the Korean Publication No. 2002-0093254.
English language abstract of the Japanese Publication No. 2002-208294.

\* cited by examiner

*Primary Examiner*—Son Dinh
*Assistant Examiner*—Nam Nguyen
(74) *Attorney, Agent, or Firm*—Marger Johnson & McCollom, P.C.

(57) ABSTRACT

In an embodiment, a semiconductor memory device has a small number of repair signal transmission lines. The semiconductor memory device includes m repair redundancy blocks, each including n repair redundant word lines, and m and n being natural numbers; and a control circuit generating n repair information signals to select the n repair redundant word lines and m block selection information signals to select the m repair redundancy blocks, and transmitting the n repair information signals and the m block selection information signals to the m repair redundancy blocks. The n repair information signals are shared by the m repair redundancy blocks. The control circuit includes n×m unit fuse boxes, n unit fuse boxes of which corresponding to each of the m repair redundancy blocks.

12 Claims, 4 Drawing Sheets

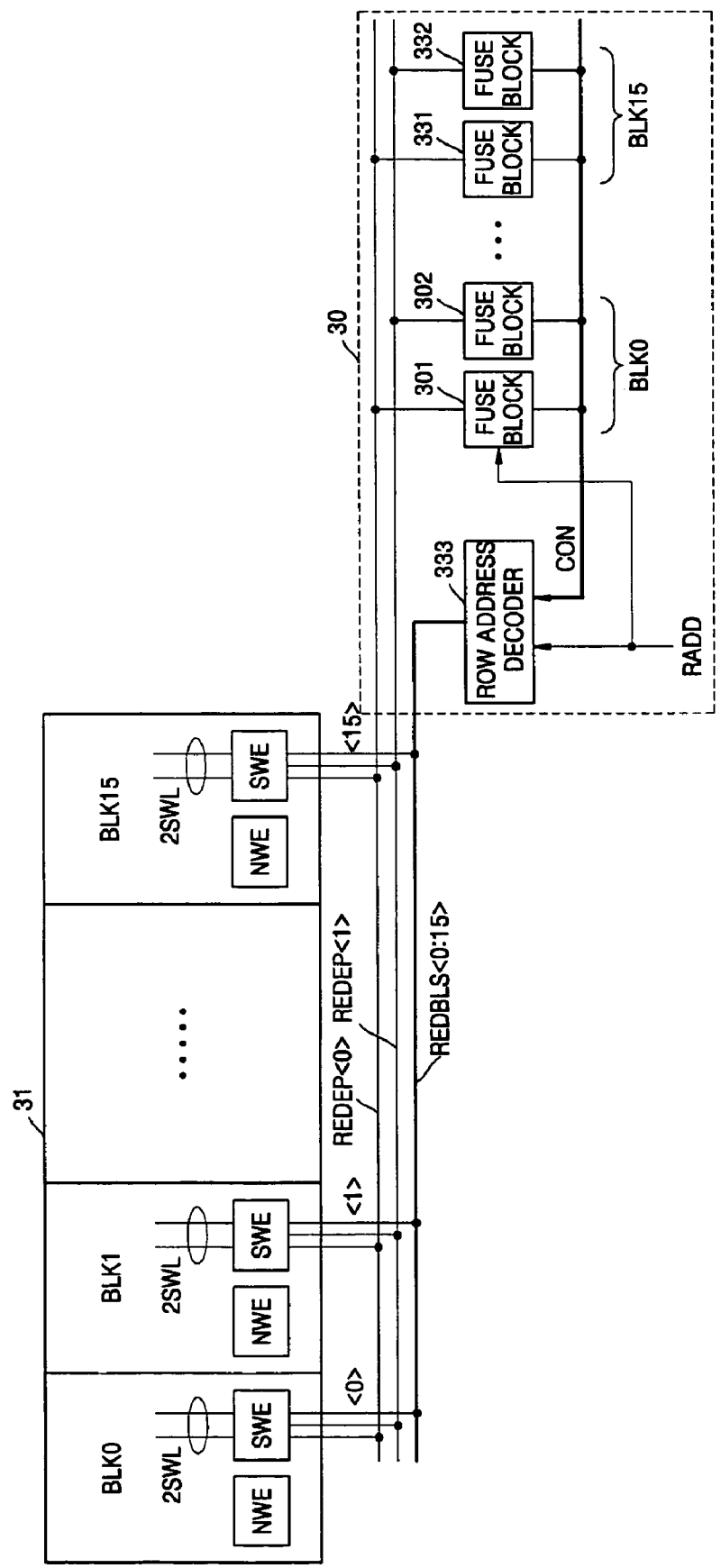

SEMICONDUCTOR MEMORY DEVICE WITH SMALL NUMBER OF REPAIR SIGNAL TRANSMISSION LINES

CROSS-REFERENCE TO RELATED PATENT APPLICATIONS

This application claims the priority of Korean Patent Application No. 10-2004-0054491, filed on Jul. 13, 2004, in the Korean Intellectual Property Office, the disclosure of which is incorporated herein in its entirety by reference.

BACKGROUND OF THE INVENTION

1. Field of the Invention

The present invention relates to a semiconductor memory device, and more particularly, to a row redundancy repair scheme of a semiconductor memory device.

2. Description of the Related Art

Recent advances in semiconductor fabrication increase the degree of integration of semiconductors, particularly semiconductor memory devices. FIG. 1 illustrates a schematic layout of a conventional highly integrated semiconductor memory device. This semiconductor memory device includes a plurality of memory cell arrays ARRAY and peripheral circuit blocks PERI. Also, column decoder blocks CDEC and row decoder/repair redundancy blocks RDC & RED are installed around each of the memory cell arrays ARRAY.

FIG. 2 is a detailed diagram illustrating the connection of a row decoder/repair redundancy block RDEC & RED to the peripheral circuit block PERI shown in the layout of FIG. 1. Referring to FIG. 2, the row decoder/repair redundancy block RDEC & RED includes a plurality of segment blocks 21, 23, 27 and 29. FIG. 2 illustrates a row decoder/repair redundancy block RDEC & RED that includes four segment blocks. However, the number of segment blocks included in a row decoder/repair redundancy block RDEC & RED is not limited. Each of the segment blocks 21 through 29 includes m repair redundancy blocks BLK0 through BLK15, and each of the m repair redundancy blocks BLK0 through BLK15 includes n repair redundant word lines SWL (m and n are natural numbers). Specifically, FIG. 2 illustrates a case where m is 16 and n is 2.

Referring to FIG. 2, 32 repair signal transmission lines for each of the segment blocks 21 through 29 are connected to a control circuit 20 in the peripheral circuit block PERI. That is, a total of 128 repair signal transmission lines REDREP<0:127> of the four segment blocks 21 through 29 are connected to the control circuit 20. The control circuit 20 generates repair signals to select repair redundant word lines SWL and transmits them to the repair redundancy blocks BLK0 through BLK15 via the repair signal transmission lines REDREP<0:127>.

As described above, this conventional semiconductor memory device requires 128 repair signal transmission lines REDREP<0:127> for one row decoder/repair redundancy block RDEC & RED. As a result, the chip length of the conventional semiconductor memory device is greater in the Y-axis direction of the layout of FIG. 1 than in the X-axis direction. This makes the conventional semiconductor memory device difficult to package.

SUMMARY OF THE INVENTION

Embodiments of the present invention provide a semiconductor memory device with a small number of repair signal transmission lines.

According to one embodiment of the present invention, a semiconductor memory device comprises m repair redundancy blocks, each including n repair redundant word lines; and a control circuit generating n repair information signals to select the n repair redundant word lines and m block selection information signals to select the m repair redundancy blocks, and transmitting the n repair information signals and the m block selection information signals to the m repair redundancy blocks. The n repair information signals are shared by the m repair redundancy blocks.

BRIEF DESCRIPTION OF THE DRAWINGS

The above and other aspects and advantages of the present invention will become more apparent by describing in detail exemplary embodiments thereof with reference to the attached drawings in which:

FIG. 4 is a detailed diagram illustrating the connection of a segment block to a control circuit shown in the layout of FIG. 3 according to an embodiment of the present invention.

DETAILED DESCRIPTION OF THE INVENTION

Figure 1:
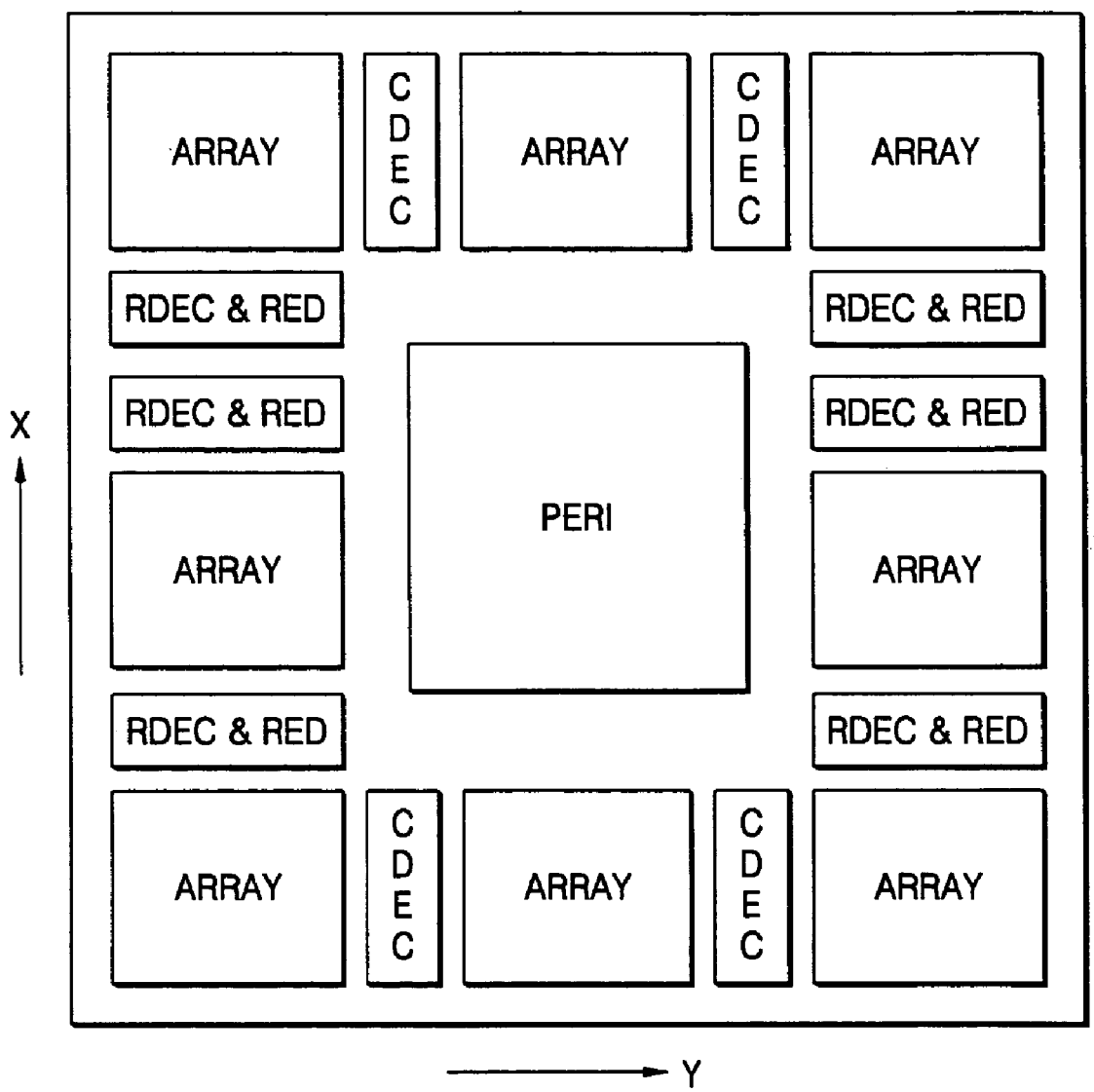
FIG. 1 is a schematic layout of a conventional highly integrated semiconductor memory device.
Figure 2:
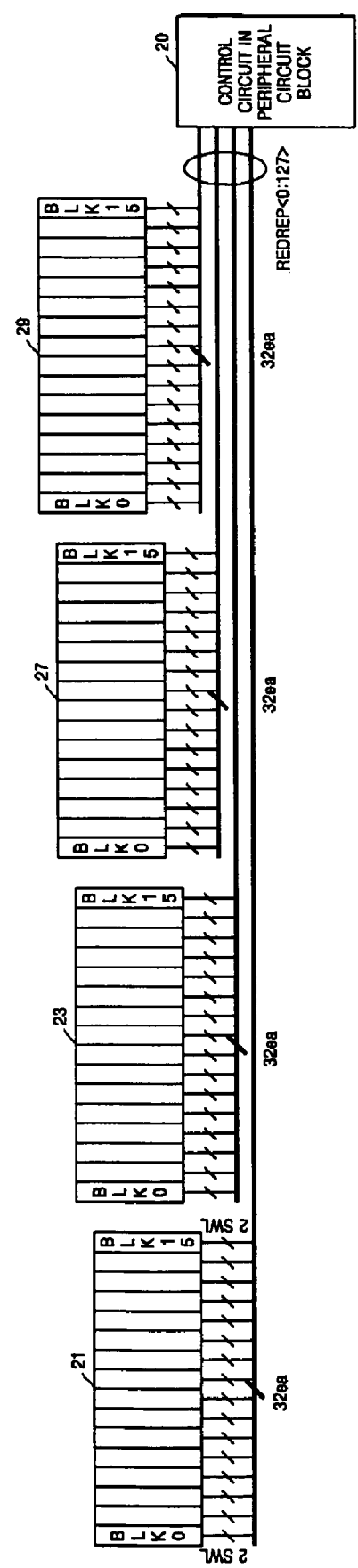
FIG. 2 is a detailed diagram illustrating the connection of a row decoder/repair redundancy block to a peripheral circuit block shown in the layout of FIG. 1.

Hereinafter, exemplary embodiments of the present invention will be described in detail with reference the accompanying drawings. The same reference numerals represent the same elements throughout the drawings.

Figure 3:
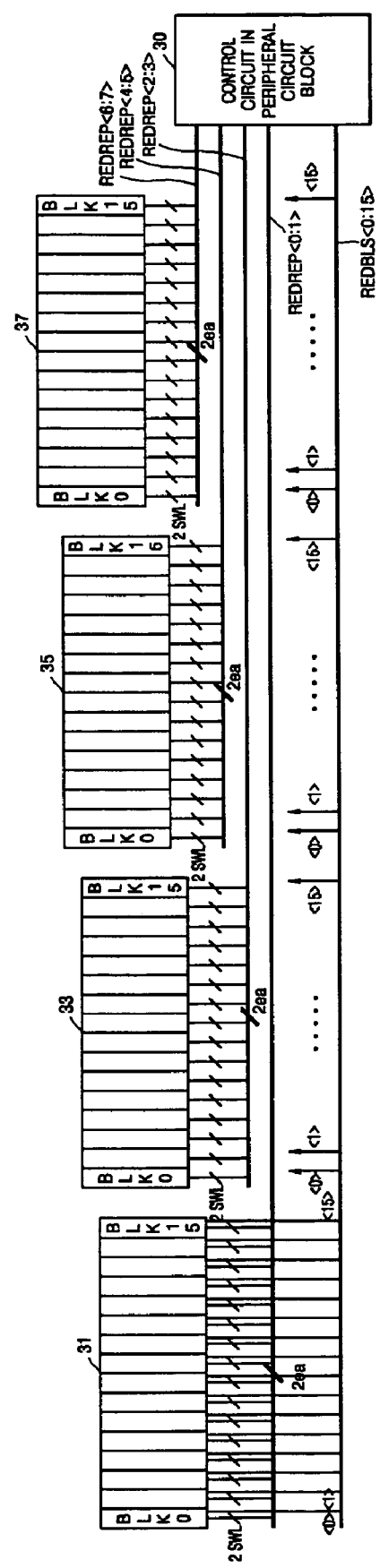
FIG. 3 illustrates a schematic layout of a semiconductor memory device according to an embodiment of the present invention.

FIG. 3 illustrates a schematic layout of a semiconductor memory device according to an embodiment of the present invention. The figure is a detailed diagram illustrating the connection of a row decoder/repair redundancy block RDEC&RED to a peripheral circuit block PERI such as that shown in FIG. 1.

Referring to FIG. 3, the row decoder/repair redundancy block RDEC&RED includes a plurality of segment blocks 31, 33, 35, and 37. For convenience, FIG. 3 illustrates a row decoder/repair redundancy block RDEC&RED that includes four segment blocks 31 through 37, but the number of segment blocks according to embodiments of the present invention is not limited. Each of the segment blocks 31 through 37 includes m repair redundancy blocks BLK0 through BLK15, and each of the repair redundancy blocks BLK0 through BLK15 includes n repair redundant word lines SWL (m and n are natural numbers). FIG. 3 illustrates a case where m is 16 and n is 2. That is, there are 16 repair redundancy blocks BLK0 through BLK15 and 2 repair redundant word lines SWL.

In this disclosure, the blocks BLK0 through BLK15 are referred to as repair redundancy blocks for convenience. However, they may substantially include normal word lines and circuits for driving the word lines, as well as the repair redundancy blocks.

In particular, in a semiconductor memory device according to an embodiment of the present invention, two repair signal transmission lines are connected to sixteen repair redundancy blocks BLK0 through BLK15 for each of the segment blocks 31 through 37. Thus, repair information signals transmitted from a control circuit 30 via two repair signal transmission lines are shared by the sixteen repair redundancy blocks BLK0 through BLK15.

Specifically, in this present embodiment, two repair signal transmission lines REDREP<0:1> are connected to the sixteen repair redundancy blocks BLK0 through BLK15 in the segment block 31; two repair signal transmission lines REDREP<2:3> are connected to the sixteen repair redundancy blocks BLK0 through BLK15 in the segment block 33; two repair signal transmission lines REDREP<4:5> are connected to the sixteen repair redundancy blocks BLK0 through BLK15 in the segment block 35; and two repair signal transmission lines REDREP<6:7> are connected to the sixteen repair redundancy blocks BLK0 through BLK15 in the segment block 37.

Further, sixteen block selection signal transmission lines REDBLS<0:15> are connected to the sixteen repair redundancy blocks BLK0 through BLK15, respectively. The sixteen block selection signal transmission lines REDBLS<0:15> are shared by all the segment blocks 31 through 37. That is, block selection information signals transmitted from the control circuit 30 via the sixteen block selection signal transmission lines REDBLS<0:15> are shared by the four segment blocks 31 through 39.

The control circuit 30 generates repair information signals to select two repair redundant word lines 2SWL of the repair redundancy blocks BLK0 through BLK15 in the segment block 31, and transmits them to the repair redundancy blocks BLK0 through BLK15 in the segment block 31 via the repair signal transmission lines REDREP<0:1>. Also, the control circuit 30 generates repair information signals to select two repair redundant word lines 2SWL of the repair redundancy blocks BLK0 through BLK15 in the segment block 33, and transmits them to the repair redundancy blocks BLK0 through BLK15 in the segment block 33 via the repair signal transmission lines REDREP<2:3>.

The control circuit 30 also generates repair information signals to select two repair redundant words lines 2SWL of the repair redundancy blocks BLK0 through BLK15 in the segment block 35, and transmits them to the repair redundancy blocks BLK0 through BLK15 in the segment block 35 via the repair signal transmission lines REDREP<4:5>. The control circuit 30 generates repair information signals to select two repair redundant word lines 2SWL of the repair redundancy blocks BLK0 through BLK15 in the segment block 37, and transmits them to the repair redundancy blocks BLK0 through BLK15 in the segment block 37 via the repair signal transmission lines REDREP<6:7>.

Further, the control circuit 30 generates block selection information signals to select the sixteen repair redundancy blocks BLK0 through BLK15 of the respective segment blocks 31 through 37, and transmits them to the repair redundancy blocks BLK0 through BLK15 via the block selection signal transmission lines.

For instance, when selecting one of the repair redundant word lines 2SWL from the repair redundancy block BLK15 of the segment block 31 to repair a failed normal word line, the block selection information signals generated by the control circuit 30 are transmitted to the repair redundancy block BLK15 of the segment block 31 via the block selection signal transmission lines REDBLS<0:15>. Also, the repair information signals generated by the control circuit 30 are transmitted to the repair redundancy block BLK15 of the segment block 31 via the repair signal transmission lines REDREP<0:1>.

Accordingly, one of the repair redundant word lines 2SWL is selected from the repair redundancy block BLK15 of the segment block 31, thereby replacing the failed normal word line with the selected repair redundant word line 2SWL.

As described above, a semiconductor memory device according to embodiments of the present invention requires the eight repair signal transmission lines REDREP<0:7> and the sixteen block selection signal transmission lines REDBLS<0:15>, i.e., a total of twenty-four transmission lines, for each of the row decoder/repair redundancy blocks RDEC&RED. For this reason, the semiconductor memory device according to embodiments of the present invention requires less transmission lines than a conventional semiconductor memory device such as that shown in FIG. 1. Therefore, the chip length of the semiconductor memory device, in the Y-axis direction of a layout such as that shown in FIG. 1, according to embodiments, is shorter than in the Y-axis direction of the layout of FIG. 1, thus allowing easy packaging of the semiconductor memory device.

FIG. 4 is a detailed diagram illustrating the connection of the segment block 31 to the control circuit 30 of FIG. 3, according to the present embodiment. Referring to FIG. 4, the control circuit 30 includes two unit fuse boxes for each of the repair redundancy blocks BLK0 through BLK15. In other words, the control circuit 30 includes a total of thirty two unit fuse boxes 301 through 332 for the sixteen repair redundancy blocks BLK0 through BLK15.

Output terminals of odd-numbered unit fuse boxes 301, 303, ..., 331 of the unit fuse boxes 301 through 332, which correspond to the repair redundancy blocks BLK0 through BLK15, respectively, are connected to the repair signal transmission line REDREP<0>. Output terminals of the other unit fuse boxes 302, 304, ..., 332 are connected to the repair signal transmission line REDREP<1>.

A row address decoder 333 receives a row address RADD, which may be generated by an external source, and control signals CON generated by the unit fuse boxes 301 through 332 via input terminals of the row address decoder 333. Output terminals of the row address decoder 333 are connected to the sixteen block selection signal transmission lines REDBLS<0:15>.

Both of the two repair signal transmission lines REDREP<0:1> are connected to redundant word line driver circuits SWE of the repair redundancy blocks BLK0 through BLK15. The sixteen block selection signal transmission lines REDBLS<0:15> are connected to the sixteen repair redundancy blocks BLK0 through BLK15, respectively.

Also shown, for this embodiment, in these repair redundancy blocks are normal word line driver circuits NWE.

For an example, fuses of the fuse boxes 331 and 332 are cut when selecting one of the repair redundant word lines 2SWL of the repair redundancy block BLK15 to repair a failed normal word line. In this case, repair information signals for the repair redundancy block BLK15 are generated by the fuse boxes 331 and 332, in a way that is well-known to one familiar in the art, and transmitted to the redundant word line driver circuit SWE of the repair redundancy block BLK15 via the repair signal transmission lines REDREP<0:1>.

Continuing with this example, the row address decoder 333 also receives the row address RADD and the control signals generated by the fuse boxes 331 and 332. The row address decoder 333 then generates a block selection signal related to the repair redundancy block BLK15, in a way that is well-known to one familiar in the art. The block selection signal is transmitted to the redundant word line driver circuit SWE of the repair redundancy block BLK15 via the block selection signal transmission line REDBLS<15>.

Accordingly, the redundant word line driver circuit SWE of the repair redundancy block BLK15 selects one of the repair redundant word lines 2SWL of the repair redundancy block BLK15 in response to the repair information signals transmitted via the repair signal transmission lines REDREP<0:1> and the block selection signal transmitted via the block selection signal transmission line REDBLS<15>. As a result, the failed normal word line is replaced with the selected repair redundant word line 2SWL.

As described above, a semiconductor memory device according to embodiments of the present invention uses the eight repair signal transmission lines REDREP<0:7> and the sixteen block selection signal transmission lines REDBLS<0:15>, i.e., a total of twenty-four transmission lines, for a row decoder/repair redundancy block RDEC&RED. Accordingly, the semiconductor memory device according to embodiments requires less transmission lines than a conventional semiconductor memory device. Thus, the chip length in the direction of Y-axis of a layout, such as that shown in FIG. 1, according to the present invention is less than in the direction of Y-axis of the layout of FIG. 1, thus allowing the semiconductor memory device to be easily packaged.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A semiconductor memory device comprising:
   a segment block including m repair redundancy blocks, each of the m repair redundancy blocks including n repair redundant word line driver circuits, wherein m and n are natural numbers;
   m block selection signal transmission lines;
   n repair signal transmission lines coupled to the segment block; and
   a control circuit to generate n repair information signals to select the n repair redundant word line driver circuits, to generate m block selection information signals to select the m repair redundancy blocks, and to transmit the n repair information signals and the m block selection information signals to the m repair redundancy blocks, the control circuit including:
      a row address decoder coupled to the m block selection signal transmission lines; and
      for each repair redundancy block, n fuse boxes, each fuse box coupled to one of the n repair signal transmission lines,
   wherein the n repair information signals are shared by the m repair redundancy blocks.

2. The semiconductor memory device of claim 1, wherein the row address decoder is configured to generate the m block selection information signals.

3. The semiconductor memory device of claim 2, wherein the row address decoder is adapted to receive an external row address signal and a control signal from the fuse boxes.

4. The semiconductor memory device of claim 1, wherein the control circuit comprises n×m unit fuse boxes, n of which correspond to each of the m repair redundancy blocks.

5. A semiconductor memory device comprising:
   a segment block including m repair redundancy blocks, each of the m repair redundancy blocks including n repair redundant word line driver circuits, wherein m and n are natural numbers;
   a control circuit to generate n repair information signals to select the n repair redundant word line driver circuits, and to generate m block selection information signals to select the m repair redundancy blocks, the control circuit including:
      a row address decoder to generate the m block selection information signals; and
      for each repair redundancy block, n fuse boxes;
   n repair signal transmission lines connected to the m repair redundancy blocks to transmit the n repair information signals to the m repair redundancy blocks, each of the fuse boxes of the control circuit coupled to one of the repair signal transmission lines; and
   m block selection signal transmission lines connected to the m repair redundancy blocks, respectively, to transmit the m block selection information signals to the in repair redundancy blocks, the m block selection signal transmission lines coupled to the row address decoder of the control circuit;
   wherein the row address decoder is adapted to receive an external row address signal and a control signal from the fuse boxes.

6. The semiconductor memory device of claim 5, wherein the n repair information signals are shared by the m repair redundancy blocks.

7. The semiconductor memory device of claim 5, wherein the fuse boxes comprise n×m unit fuse boxes, n of which correspond to each of the m repair redundancy blocks.

8. A semiconductor memory device comprising:
   p segment blocks, each having m repair redundancy blocks, each of the m repair redundancy blocks having n repair redundant word lines, wherein m, n, and p are natural numbers greater than one;
   m block selection signal transmission lines;
   n×p repair signal transmission lines, each segment block coupled to n of the repair signal transmission lines;
   a control circuit including:
      a row address decoder coupled to the m block selection signal transmission lines; and
      for each repair redundancy block of each segment block:
         n fuse blocks, each fuse block coupled to one of the n repair signal transmission lines associated with the segment block.

9. A semiconductor memory device comprising:
   p segment blocks each having m repair redundancy blocks, the repair redundancy blocks each having n redundant word line driver circuits;
   m block selection signal transmission lines;
   n×p repair signal transmission lines, each segment block coupled to n of the repair signal transmission lines; and
   a control circuit to generate a repair information signal to select one of the redundant word line driver circuits via one of the repair signal transmission lines, and to generate a block selection signal, transmitted via one of the block selection signal transmission lines, to select one of the repair redundancy blocks, the control circuit including:
      a row address decoder coupled to the m block selection signal transmission lines; and
      for each repair redundancy block, one fuse box for each of the n redundant word line driver circuits, each fuse box including a fuse that is cut to select one of the at least one redundant word line driver circuits, and each fuse box is connected to one of the repair signal transmission lines of the associated segment block.

10. The semiconductor memory device of claim 9, wherein the row address decoder is configured to generate the block selection signal.

11. The semiconductor memory device of claim 8, wherein the control circuit further comprises:
   a plurality of control lines;
   wherein:
      the row address decoder is coupled to the control lines; and
      each fuse block is coupled to a corresponding one of the control lines.

12. The semiconductor memory device of claim 11, wherein:
   the row address decoder is responsive to a row address; and
   each fuse block is responsive to the row address.

* * * * *

UNITED STATES PATENT AND TRADEMARK OFFICE
CERTIFICATE OF CORRECTION

PATENT NO. : 7,359,242 B2  Page 1 of 1
APPLICATION NO. : 11/180505
DATED : April 15, 2008
INVENTOR(S) : Du-Yeul Kim It is certified that error appears in the above-identified patent and that said Letters Patent is hereby corrected as shown below:

Title Page Other Publications, Item [56] English language abstract of the Japanese Publication No. 0173933., the word "Japanese" should read -- Korean --;
Column 6, line 16, claim 5 the words "the in repair" should read -- the m repair --.

Signed and Sealed this

Seventh Day of October, 2008

JON W. DUDAS
*Director of the United States Patent and Trademark Office*